(12) United States Patent
Braunisch et al.

(10) Patent No.: US 7,646,093 B2
(45) Date of Patent: Jan. 12, 2010

(54) THERMAL MANAGEMENT OF DIES ON A SECONDARY SIDE OF A PACKAGE

(75) Inventors: Henning Braunisch, Chandler, AZ (US); Chuan Hu, Chandler, AZ (US); Gloria Alejandra Camacho Bragado, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 11/613,523

(22) Filed: Dec. 20, 2006

(65) Prior Publication Data

US 2008/0150125 A1    Jun. 26, 2008

(51) Int. Cl.
*H01L 23/36* (2006.01)
(52) U.S. Cl. .............................. 257/718; 257/E23.103; 257/686; 257/723; 438/117
(58) Field of Classification Search .................. 257/717
See application file for complete search history.

(56) References Cited

U.S. PATENT DOCUMENTS

| | | | | |
|---|---|---|---|---|
| 5,198,887 | A * | 3/1993 | Brown | 361/717 |
| 5,659,458 | A * | 8/1997 | Patchen | 361/704 |
| 6,304,450 | B1 * | 10/2001 | Dibene et al. | 361/704 |
| 6,580,611 | B1 | 6/2003 | Vandentop et al. | |
| 6,756,684 | B2 * | 6/2004 | Huang | 257/778 |
| 6,989,592 | B2 * | 1/2006 | Chang et al. | 257/707 |
| 2002/0189795 | A1 * | 12/2002 | Bhatia et al. | 165/104.33 |
| 2003/0077853 | A1 * | 4/2003 | Kinsman et al. | 438/106 |
| 2004/0016995 | A1 * | 1/2004 | Kuo et al. | 257/678 |
| 2008/0085962 | A1 * | 4/2008 | Simone et al. | 524/403 |

OTHER PUBLICATIONS

Braunisch, H. et al., "Method for BBUL package with two-sided heat removal," www.ip.com, document No. IPCOM000007238D, Mar. 6, 2002.
Braunisch, H. et al., "Method for a BBUL package with two-sided heat removal," www.ip.com, document No. IPCOM000007238D, Nov. 2001.

(Continued)

*Primary Examiner*—Sue A. Purvis
*Assistant Examiner*—Krista Soderholm
(74) *Attorney, Agent, or Firm*—Blakely, Sokoloff, Taylor & Zafman LLP (57) ABSTRACT

An apparatus including a first die mounted on a primary side of an electronic package and a second die mounted on a secondary side of the electronic package between the electronic package and a printed circuit board. The apparatus further comprising a thermal component thermally connected to the second die and mounted on the printed circuit board, the thermal component comprising a set of pins extending from a heat sink through a set of through-holes in the printed circuit board. A method including positioning a set of thermal connectors through a printed circuit board, the thermal connectors extending from a primary side of the printed circuit board to a secondary side of the printed circuit board opposite the primary side. The method further including thermally connecting the thermal connectors to a die positioned between an electronic package and the primary side of the printed circuit board to transfer heat from the die to the secondary side of the printed circuit board.

26 Claims, 4 Drawing Sheets

OTHER PUBLICATIONS

Eastman, J. A. et al., "Anomalously increased effective thermal conductivities of ethylene glycol-based nanofluids containing copper nanoparticles," Applied Physics Letters vol. 78 (6, 5), Feb. 5, 2001, pp. 718-720.

Keblinski, P. et al., "Mechanisms of heat flow in suspensions of nano-sized particles (nanofluids)," International Journal of Heat and Mass Transfer vol. 45, 2002, pp. 855-863.

Patel, Hrishikesh E. et al., "Thermal conductivities of naked and monolayer protected metal nanoparticle based nanofluids: Manifestation of anomalous enhancement and chemical effects," Applied Physics Letters vol. 83 (14), 2003, pp. 2931-2933.

Leong, Chia-Ken et al., "Carbon black pastes as coatings for improving thermal gap-filling materials", Carbon vol. 44, 2006, pp. 435-440.

Chiu, Chia-Pin, "Method for a thermal-enhanced socket for packages with an integrated voltage regulator," www.ip.com, document No. IPCOM000138138D, Jul. 10, 2006.

* cited by examiner

THERMAL MANAGEMENT OF DIES ON A SECONDARY SIDE OF A PACKAGE

FIELD

Embodiments described herein relate to the field of heat removal from an electronic appliance. More particularly, removal of heat from a computer system having dies mounted on a secondary side of an electronic package.

BACKGROUND

The demand for small form-factor, high-speed computing systems has led to placing dies on a side of an electronic package adjacent a substrate, for example, a printed circuit board, mounted parallel to the electronic package. Dies placed on the electronic package often produce a significant amount of heat. Substrates such as printed circuit boards, however, are generally not good thermal conductors. Thus, the substrate may not be able to adequately dissipate the heat generated by the die. In this aspect, heat may be retained between the electronic package and the printed circuit board and potentially impact the performance and reliability of the computing system.

BRIEF DESCRIPTION OF THE DRAWINGS

The features, aspects, and advantages of the invention will become more thoroughly apparent from the following detailed description, appended claims, and accompanying drawings that are used to illustrate embodiments of the invention. In the drawings:

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
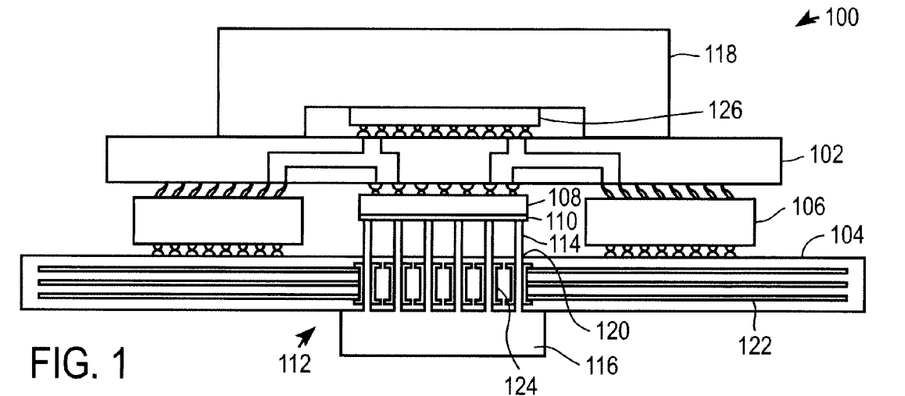
FIG. 1 shows a cross-sectional side view of two dies mounted to an electronic package and a thermal component including a heat sink and a set of pins that thermally connect one of the dies to the thermal component.

FIG. 1 shows a cross-sectional side view of two dies mounted to an electronic package and a thermal component including a heat sink and a set of pins that thermally connect one of the dies to the thermal component. In this embodiment, electronic assembly 100 includes a socket 106 to connect package 102 to printed circuit board 104. Alternatively, electronic assembly 100 may include more than one socket. Package 102 may be electrically connected to printed circuit board 104, in this embodiment, through contacts extending from socket 106 between corresponding contact pads on package 102 and printed circuit board 104. One or more dies may be electrically and mechanically connected to package 102 by, for example, solder connections (e.g., solder balls) between corresponding connection pads on the die and package 102. As shown in FIG. 1, die 108 and die 126 are connected to package 102. Suitable dies may include, but are not limited to, in-silicon voltage regulator (ISVR) dies, central processing unit (CPU) in conventional or die-down, power-up (DDPU) configurations, memory or graphics-and-memory controller hub (GMCH). In one embodiment, die 108 is connected to a secondary side of package 102 and die 126 is connected to a primary side of package 102. The term "primary side" as used herein generally refers to a top side of the package or printed circuit board as shown in the Figures which is opposite that of the "secondary side." The term "secondary side" as used herein generally refers to a pin or land side of the package or a back side of a printed circuit board, i.e., the bottom side of the package or board as shown in the Figures. Alternatively, die 108 and die 126 may be connected to the same side of package 102.

In the embodiment of FIG. 1, heat generated from die 126 is dissipated through integrated heat spreader 118 connected to the primary side of package 102 as shown. Heat generated from die 108 is dissipated through thermal component 112 which extends from the secondary side to the primary side of printed circuit board 104. Thermal component 112 is thermally connected to die 108 through a set of thermal connectors extending from heat sink 116. In this embodiment, thermal connectors are pins 114 extending from heat sink 116. The term "heat sink" as used herein generally refers to any component designed to transfer or dissipate heat. The design of the heat sink, such as heat sink 116 is not intended to be limited to any particular heat sink design details such as, but not limited to, the material or geometry used for the heat sink. Heat sink 116 may be of any thermally conductive structure and material, including, but not limited to copper, aluminum or any other metal alloy or non-metal that would be suitable for transferring the heat to another location such as the ambient or the wall of a box. In some embodiments, heat sink 116 may be an active or passive air cooling solution, water cooling solution or refrigeration solution.

Set of pins 114 extends from heat sink 116 and through openings or through-holes 120 in printed circuit board 104. Pins 114 may be made of any thermally conductive material including the same material as heat sink 116 or a different material. Pins 114 may be positioned along a surface of heat sink 116 such that they may be aligned with through-holes 120 of printed circuit board 104. In the embodiment illustrated in FIG. 1, through-holes 120 include side-wall plating 124, for example, a hollow cylinder formed of copper. In this aspect, through-holes 120 are plated through-holes formed by any suitable technique, for example, drilling and plating. In addition to copper, suitable plating materials may include, but are not limited to aluminum, metal alloys and the like. Suitable plating techniques include, but are not limited to, chemical vapor deposition, electroless plating, electroplating and the like.

In other embodiments, through-holes 120 are non-plated through-holes formed in printed circuit board 104 by any suitable technique, for example, milling, drilling or reaming. In still further embodiments, it is contemplated that through-holes 120 and pins 114 may be omitted and replaced with thermal connectors which are solid cylinders of a thermally conductive material formed through printed circuit board 104. In this embodiment, the thermal connectors are filled through-vias formed where through-holes 120 are shown to thermally connect components on the primary side of printed circuit board 104 to those on the secondary side of printed circuit board 104. For example, a set of solid cylinders of a thermally conductive material, for example, copper, may be formed through printed circuit board 104.

Through-holes 120 may be formed within a region of printed circuit board 104 having dimensions similar to an outer perimeter of die 108. The number and dimensions of through-holes 120 and pins 114 may be such that they allow for sufficient dissipation of heat across printed circuit board 104 without compromising the mechanical integrity or electrical connectivity of printed circuit board 104. In one embodiment, mechanical and electrical integrity is maintained where through-holes 120 occupy an area of a surface of printed circuit board 104 of about 15 percent (%). In other embodiments, the area of coverage of the surface of printed circuit board 104 by through-holes 120 may be less than 15%. In this aspect, where a particular number of through-holes 120 are desired, dimensions of through-holes 120 may be modified such that an area defined by through-holes 120 combined occupies 15% of the surface area of printed circuit board 104. For example, where a larger number of through-holes are desired, a diameter of the through-holes may be reduced so that the area of the surface of printed circuit board 104 occupied by through-holes 120 combined is 15% or less.

In some embodiments, 15% of a portion of the surface area of printed circuit board 104 is occupied by through-holes 120. The portion may be defined by a perimeter of a surface of printed circuit board 104. Alternatively, the portion may be defined by a surface dimension of die 108. For example, the relevant portion of printed circuit board 120 may be defined by a footprint of die 108 such that through-holes 120 occupy 15% of this area.

In turn, the number and dimensions of pins 114 may correspond to the number and dimensions of through-holes 120 such that they may be received by through-holes 120. In this aspect, when heat sink 116 is positioned along the secondary side of printed circuit board 104 and moved in a direction toward printed circuit board 104, pins 114 extend through through-holes 120 to the primary side of printed circuit board 104. Pins 114 may be integrally formed with heat sink 116 or connected to heat sink 116 by, for example, soldering or press fitting. Alternatively, pins 114 may be spring connected to heat sink 116 to compensate for tolerances in socket stackup including, for example, ball grid array (BGA) interface between socket 106 and printed circuit board 104. A length of pins 114 may be at least that of a thickness of printed circuit board 104. Still further, pins 114 may be any length suitable to extend from the secondary side of printed circuit board 104 to a surface of die 108. In this aspect, pins 114 may be directly connected to die 108.

Alternatively, pins 114 may have a length suitable to extend from the secondary side of printed circuit board 104 to a thermal interface material 110 applied to the surface of die 108 as shown in FIG. 1. In this embodiment, pins 114 penetrate into thermal interface material 110 to further enhance the heat transfer to heat sink 116 and shorten the thermal path. Thermal interface material 110 may be used to promote adhesion and heat transfer between die 108 and pins 114. Thermal interface material 110 may mechanically decouple die 108 from direct contact with pins 114 which could potentially crack or otherwise compromise die 108. In this aspect, a thickness of thermal interface material 110 between die 108 and pins 114 may be that which is sufficient to allow pins 114 to penetrate thermal interface material 110 yet still prevent direct contact between die 108 and pins 114. Thermal interface material 110 may further have a sufficient thickness to compensate for height tolerances in the socket stack up between printed circuit board 104 and electronic package 102.

Thermal interface material 110 may be any material having a low processing temperature. In some embodiments, thermal interface material 110 may be a paste, including, but not limited to, a thixotropic paste, carbon black paste or fluidic paste. In still further embodiments, thermal interface material 110 may be a polymer. It is further contemplated that thermal interface material 110 may be a nanoparticle loaded composite, i.e. nanofluid. Materials such as copper, silver and other metal nanoparticles are able to increase the thermal conductivity of the medium that contains them. In this aspect, high thermal conduction can be maintained even for small contact areas, such as that found at ends of pins 114. In one embodiment, nanoparticles of a good thermal conductor, for example, copper, may be suspended in a gel or fluid and applied to die 108 to enhance the thermal conductivity between die 108 and pins 114.

In the embodiment illustrated in FIG. 1 wherein through-holes 120 are plated through-holes, through-holes 120 are plated with a thermally or electrically conductive material as previously described prior to insertion and soldering of pins 114 within through-holes 120. Suitable soldering techniques include wave soldering and selective soldering. It is contemplated that pins 114 inserted in through-holes 120 having plating 124 and occupying an area of about 15% of a surface of printed circuit board 104 will have a low thermal resistance. For example, in one embodiment, through-holes 120 occupying an area of about 15% of a surface of printed circuit board 104 are made of and plated with copper. In this embodiment the secondary side of assembly 100 has an effective thermal conductivity of about 60 watts per meter per Kelvin (W/m·K). Where a thickness of printed circuit board 104 is, for example, from about 1 millimeter (mm) to about 2 mm, such that through-holes 120 are about 2 mm in length, the thermal impedance of copper plated through-holes 120 is about 0.3 degrees Celsius centimeter squared per watt (° C. cm$^2$/W). This thermal impedance is much smaller than the thermal impedance from a thermal interface material or the thermal impedance between a secondary package side die to a primary package side heat sink and therefore does not pose a significant thermal barrier to assembly 100.

Through-holes 120 having plating 124 may be used to electrically connect pins 114 inserted through through-holes 120 with one or more conductive pathways or layers 122 within printed circuit board 104. By electrically connecting pins 114 and printed circuit board 104, thermal component 112 may be grounded. Alternatively, thermal component 112 may be grounded in the absence of pins 114 by filled through-vias formed through printed circuit board 104 that are connected to layers 122 and thermal component 112 in a similar manner to that of pins 114. As such, grounding is achieved without a substantial modification to printed circuit board 104. Grounding is often necessary to mitigate any electromagnetic interference (EMI) issues. It is further contemplated that if die 108 makes electrical contact to thermal component 112, this additional electrical path could provide electrical power delivery to not only die 108 but the entire assembly 100. Still further, electrical contact through side walls of through-holes 120 having plating 124 would open up an additional lateral thermal path from thermal element 112 into printed circuit board layers 122. The thermal and electrical resistances of this additional path and their ratio could be designed as desired by patterning connected metal layers 122 surrounding through-holes 120 having plating 124.

Figure 2:
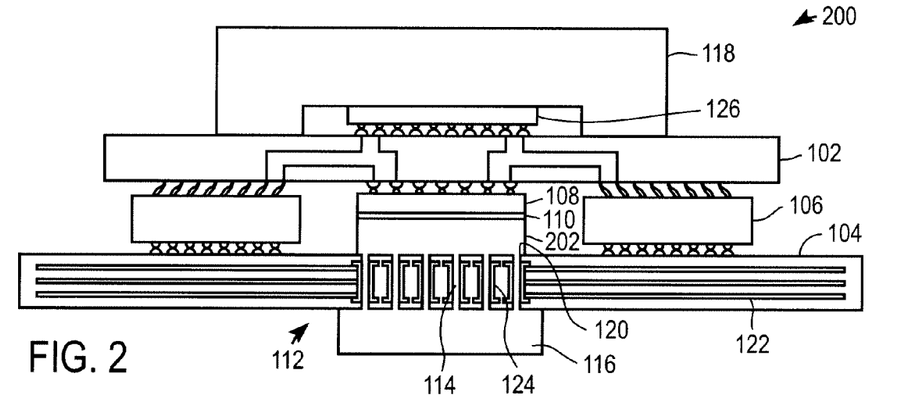
FIG. 2 shows a cross-sectional side view of two dies mounted to an electronic package and a thermal component including a heat spreader connected to one of the dies, a heat sink connected to a printed circuit board and a set of pins that connect the heat spreader to the heat sink.

FIG. 2 shows a cross-sectional side view of two dies mounted to an electronic package and a thermal component including a heat spreader connected to one of the dies, a heat sink connected to a printed circuit board and a set of pins that connect the heat spreader to the heat sink. Similar to FIG. 1, electronic assembly 200 includes one or more sockets 106 to electrically and mechanically connect package 102 to printed circuit board 104. One or more dies, such as die 108 and die 126 may be electrically and mechanically connected to package 102 as described in reference to FIG. 1. In this aspect, die 108 is connected to the secondary side of package 102 and die 126 is connected to the primary side of package 102.

Heat generated from die 126 is dissipated through integrated heat spreader 118 connected to the primary side of package 102 as shown. To dissipate heat from die 108, thermal component 112 extending from a secondary side to a primary side of printed circuit board 104 is thermally connected to die 108. Similar to FIG. 1, thermal component 112 includes heat sink 116 and a set of pins 114. Thermal component 112 further includes heat spreader 202 connected to ends of pins 114 opposite that of heat sink 116 and die 108. Heat spreader 202 may be connected to ends of pins 114 by any suitable technique, including, but not limited to, soldering pins 114 to the surface of heat spreader 202 or by a press fit technique. In this aspect, heat spreader 202 is thermally connected to die 108. Heat spreader 202 may be of substantially the same material as that of heat sink 116. Alternatively, heat spreader 202 may be of any material and have any dimension suitable for providing more heat transfer from dies with high non-uniform power density than that provided by pins 114 alone.

Through-holes 120 of printed circuit board 104, through which pins 114 extend, may be through-holes 120 including a plating 124 of an electrically conductive material. Alternatively, through-holes 120 may be non-plated through-holes. In still further embodiments, pins 114 and through-holes 120 may be replaced with filled through-vias filled with an electrically conductive material. In embodiments where through-holes 120 are plated with plating 124, the sidewalls may be in contact with selected conductive layers 122 of printed circuit board 104. In this aspect, an electrical connectivity may be achieved between pins 114 extending through through-holes 120 and printed circuit board 104. In turn, an electrical path may be created between die 108 to facilitate delivery of electrical power to die 108, package 102 and die 126.

In one embodiment, pins 114 and the process of inserting and soldering them are replaced by forming filled through-vias as previously discussed with a suitable material such as copper, e.g., by electroplating. In this case heat sink 116 and heat spreader 202 are bonded to the filled through-vias near the top and bottom surface of printed circuit board 104.

Thermal interface material 110 may be positioned between heat spreader 202 and die 108 to ensure good thermal contact between heat spreader 202 and die 108. The material and dimensions of thermal interface material 110 may be substantially similar to that described in regard to FIG. 1. Alternatively, in this embodiment, a layer of thermal interface material 110 thinner than that described in the embodiment shown in FIG. 1 may be used. As shown in FIG. 2, heat spreader 202 provides a greater die to heat spreader contact area than pins 114 and does not protrude into thermal interface material 110 like pins 114. In this aspect, less of thermal interface material 110 is needed to ensure thermal contact and protect die 108 from, for example, cracking due to contact between die 108 and thermal component 112. In this embodiment, the heat spreader 202 is assembled on printed circuit board 104 before mounting the package 102 onto socket 106 or is attached onto second die 108 before mounting package 102 onto socket 106.

Figure 3:
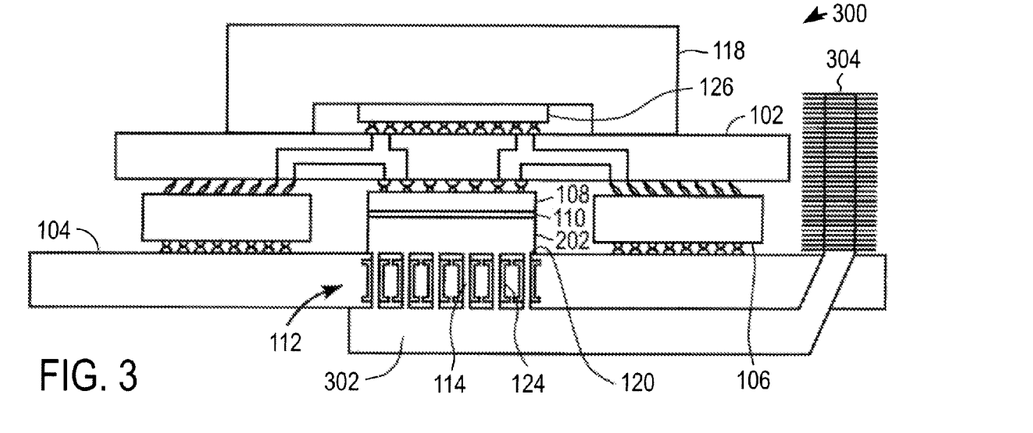
FIG. 3 shows a cross-sectional side view of two dies mounted to an electronic package, a thermal component including a heat spreader and a set of thermal pins and a heat pipe.

FIG. 3 shows a cross-sectional side view of a die mounted to an electronic package, a thermal component including a heat spreader and a set of pins and a heat pipe. In this embodiment, electronic assembly 300 includes one or more sockets 106 to electrically and mechanically connect package 102 to printed circuit board 104. One or more dies, such as die 108 and die 126 may be electrically and mechanically connected to package 102. In this aspect, die 108 is connected to the secondary side of package 102 and die 126 is connected to the primary side of package 102. Heat generated from die 126 is dissipated through integrated heat spreader 118 connected to package 102 as shown.

Similar to FIG. 2, thermal interface material 110 and thermal component 112 are thermally connected to die 108 to dissipate heat from die 108 to the secondary side of printed circuit board 104. Thermal component 112 includes a set of pins 114 extending from heat spreader 202. Heat spreader 202 and pins 114 are of substantially the same material and connected to one another in substantially the same manner as described in reference to FIG. 2. Pins 114 extend through through-holes 120 to the secondary side of printed circuit board 104. Through-holes 120 may be plated with plating 124 to allow for electrical connection between pins 114 and conductive layers (not shown) within printed circuit board 104 as described in reference to FIG. 1. Heat pipe 302 is placed adjacent the secondary side of printed circuit board 104. Heat pipe 302 is mechanically and thermally connected to thermal component 112 to further increase heat removal from electronic assembly 300. Heat pipe 302 may be connected to ends of pins 114 by any suitable technique, including, but not limited to, soldering pins 114 to the surface of heat pipe 302 or by a press fit technique.

Pins 114 may be solid or hollow depending upon the amount of heat removal from electronic assembly 300 that is desired. For example, when hollow pins 114 are connected to heat pipe 302, a fluid, such as a phase-changing fluid, from heat pipe 302 can be transported along the length of pins 114 to heat spreader 202. When the fluid evaporates the vapor transfers heat collected at heat spreader 202 to the secondary side of printed circuit board 104, in turn cooling die 108. Since a higher temperature is found at heat spreader 202 than the ends of pins 114, greater cooling is achieved when the fluid of heat pipe 302 is able to reach heat spreader 202. Similarly, although heat spreader 202 is shown in FIG. 3 to be solid, heat spreader 202 may be hollow when even greater heat removal is desired. It is contemplated that any number of combinations of hollow or solid heat spreaders and pins may be provided by thermal component 112 depending upon the level of cooling deemed desirable. For example, in some embodiments, both heat spreader 202 and pins 114 may be solid. It is further contemplated that another heat spreader or heat sink may be connected to pins 114 at the secondary side of printed circuit board 104 such as that shown in FIG. 2. In this embodiment, heat pipe 302 is connected to the heat spreader or heat sink along the secondary side of printed circuit board 104 instead of directly to pins 114. In this embodiment, the additional heat spreader or heat sink may be hollow to allow for transport of the fluid from heat pipe 302.

Heat pipe 302 is connected to a unit that enables dissipation of heat from heat pipe 302 while still accommodating different dimensional constraints of assembly 300. In some embodiments, the unit is a remote heat exchanger 304 or condensation system. Heat pipe 302 may extend laterally away from and out of the shadow of package 102 and socket 106. It may then pass through an opening in printed circuit board 104 to its primary side and connect to remote heat exchanger 304, which otherwise may not fit in the space underneath the secondary side of the printed circuit board 104. It is further contemplated that additional cooling components and mechanisms, such as cooling fans, heat sinks and the like can be included to further dissipate heat from assembly 300.

Figure 4A:
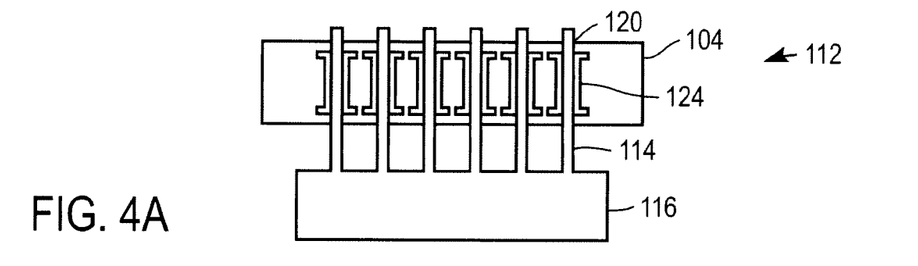
FIG. 4A shows a technique for assembling the thermal component of FIG. 1.
Figure 4B:
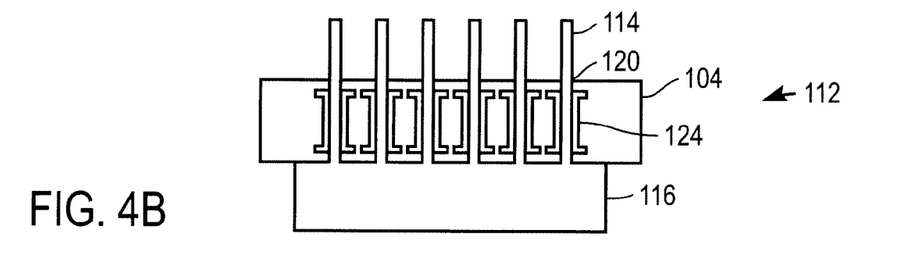
FIG. 4B shows a technique for assembling the thermal component of FIG. 1.

FIGS. 4A and 4B show a technique for assembling the thermal component of FIG. 1. As shown in FIG. 4A, thermal component 112 includes pins 114 extending from heat sink 116. Through-holes 120 of printed circuit board 104 are formed in an area underneath die 108 and may be plated with plating 124 as described in reference to FIG. 1. Heat sink 116 is positioned along the secondary side of printed circuit board 104 and pins 114 are aligned with through-holes 120. Pins 114 are then inserted into through-holes 120 so that they extend through printed circuit board 104. Pins 114 may extend beyond the primary side surface of printed circuit board 104 any distance sufficient to allow for a thermal connection between pins 114 and die 108. In the embodiment of FIG. 4B, pins 114 are shown extending as far beyond the primary side surface of printed circuit board 104 as heat sink 116 will allow. In some embodiments, solder may be applied to pins 114 to keep pins 114 and, in turn, thermal component 112, in place. Solder may further be applied to create an electrical contact between pins 114 and printed circuit board 104. Any suitable technique may be used for soldering pins 114 to printed circuit board 104, such as, but not limited to, wave soldering and selective soldering. Once thermal component 112 is in position, printed circuit board 104 may be connected to sockets 106 and die 108 as described in reference to FIG. 1.

Figure 5A:
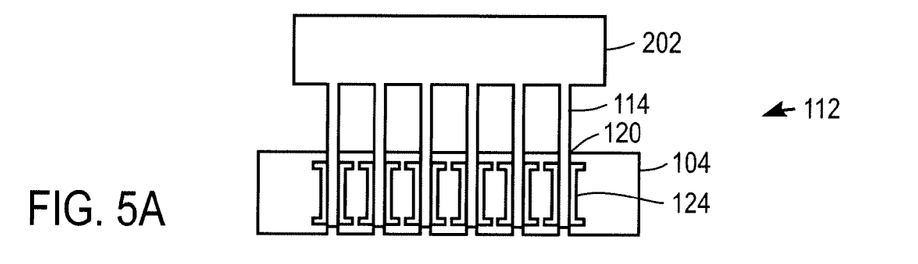
FIG. 5A shows a technique for assembling the thermal component of FIG. 2.
Figure 5B:
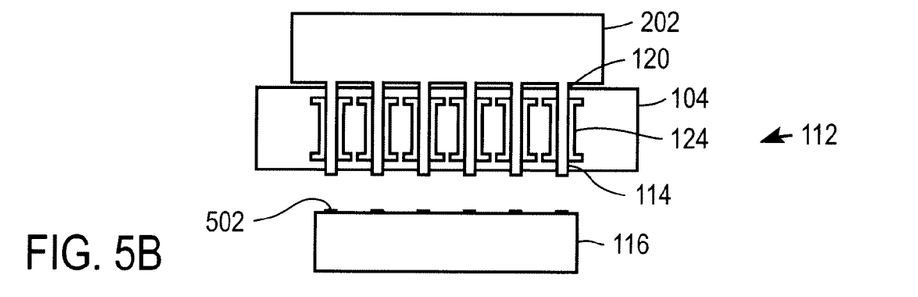
FIG. 5B shows a technique for assembling the thermal component of FIG. 2.
Figure 5C:
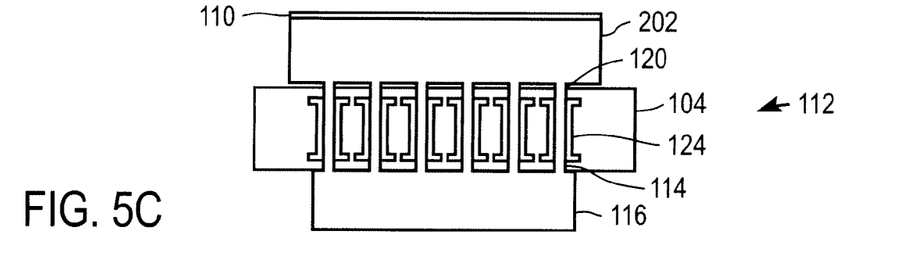
FIG. 5C shows a technique for assembling the thermal component of FIG. 2.

FIGS. 5A, 5B and 5C show a technique for assembling the thermal component of FIG. 2. In this embodiment, printed circuit board 104 includes through-holes 120 which may be plated with plating 124 as described in reference to FIG. 1. Thermal component 112 includes heat spreader 202, pins 114 and heat sink 116. Initially, heat spreader 202 is connected to pins 114 without heat sink 116 so that pins 114 may be inserted through through-holes 120 from a primary side of printed circuit board 104. In some embodiments, thermal component 112 is connected to printed circuit board 104 prior to mounting of printed circuit board 104 to package 102. Alternatively, mounting of printed circuit board 104 to package 102 and insertion of pins 114 through through-holes 120 of printed circuit board 104 occur simultaneously. For example, heat spreader 202 may be connected to die 108 prior to insertion of pins 114 through printed circuit board 104. In this aspect, the mounting of printed circuit board 104 to package 102 causes pins 114 to be inserted through through-holes 120. Alternatively, pins 114 may be inserted through through-holes 120 from a secondary side of printed circuit board 104.

Once pins 114 are inserted through through-holes 120 to an opposite side of printed circuit board 104, heat sink 116 may be connected to pins 114. In one embodiment, a length of pins 114 is substantially equivalent to a thickness of printed circuit board 104 such that pins 114 protrude only slightly beyond the surface of printed circuit board 104. In this aspect, a surface of heat sink 116 connected to pins 114 is substantially flush to the secondary side surface of printed circuit board 104 when it is connected to pins 114 as shown in FIG. 5C. Alternatively, pins 114 may be longer than the thickness of printed circuit board 104 such that a surface of heat sink 116 does not directly contact printed circuit board 104. Once pins 114 are inserted through through-holes 120, solder may optionally be applied to pins 114 to keep thermal component 112 in place and provide electrical contact to printed circuit board 104. Once pins 114 are properly positioned through through-holes 120, heat sink 116 is connected to pins 114. Heat sink 116 may be connected to pins 114, by for example, soldering or a press fit mechanism at regions 502. In this aspect, the connecting of heat sink 116 to pins 114 may be used instead of solder to keep thermal component 112 in place. Thermal interface material 110 may be applied to heat spreader 202 as described in reference to FIG. 1 to ensure thermal contact between heat spreader 202 and die 108 on the secondary side of package 102. Alternatively, thermal interface material 110 may be applied directly to die 108 prior to connecting printed circuit board 104 and thermal component 112 to package 102.

Figure 6:
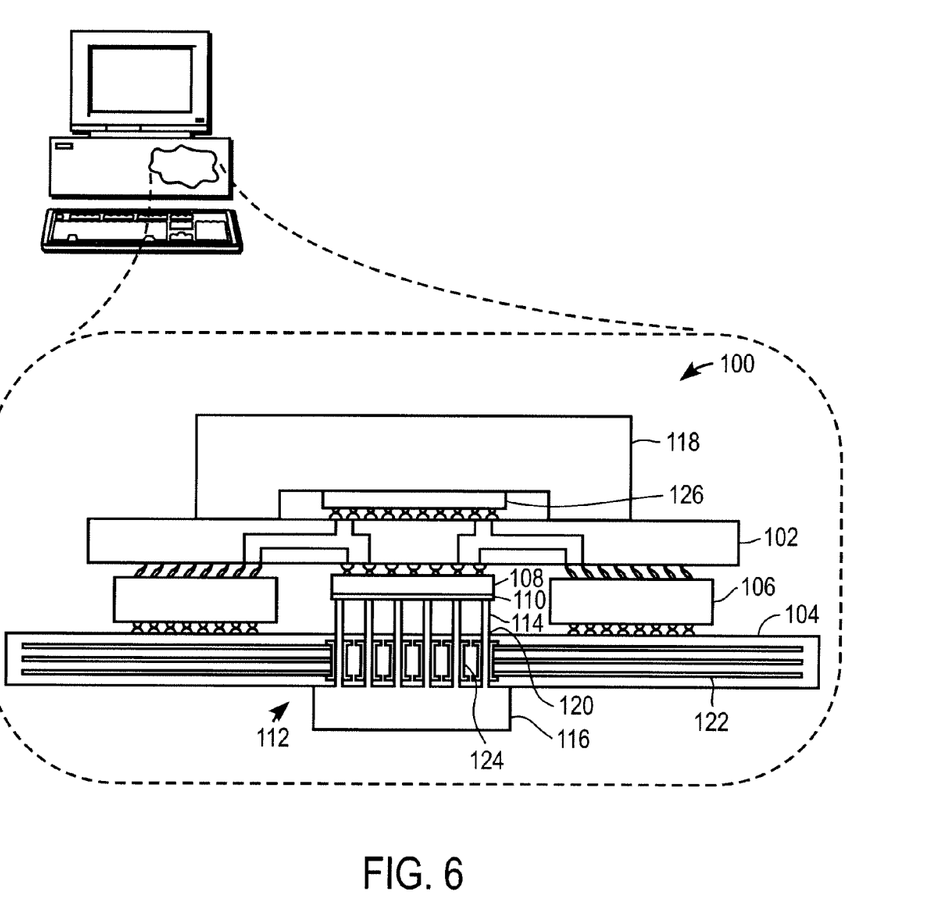
FIG. 6 shows a package connected to a printed circuit board and a computer system.

FIG. 6 shows an embodiment of an electronic assembly including a package connected to a printed circuit board. Electronic assembly 100 may be part of an electronic appliance such as a computer (e.g., desktop, laptop, hand-held, server, internet appliance, etc.), a wireless communications device (e.g., cellular phone, cordless phone, pager), a computer-related peripheral (e.g., printer, scanner, monitor), and entertainment device (e.g., television, radio, stereo, tape player, compact disc player, video cassette recorder, Moving Picture Experts Group Audio Layer 3 (MP3) player, video game console and the like). FIG. 6 shows electronic assembly 100 that is part of a desktop computer.

In the embodiment shown in FIG. 6, electronic assembly 100 is substantially similar to that described in reference to FIG. 1. Electronic assembly 100 includes one or more sockets 106 to electrically and mechanically connect package 102 to printed circuit board 104. Die 108 and die 126 are electrically and mechanically connected to package 102. In one embodiment, die 108 is connected to a secondary side of package 102 and die 126 is connected to a primary side of package 102. Integrated heat spreader 118 is connected to die 126 to dissipate heat from die 126. Thermal component 112 extending from a secondary side to a primary side of printed circuit board 104 is thermally connected to die 108 to dissipate heat from die 108. In this embodiment, thermal component 112 includes a set of pins 114 extending from heat sink 116. Pins 114 extend through through-holes 120 of printed circuit board 104 to thermally connect heat sink 116 to die 108. Thermal interface material 110 is thermally connected to die 108 and pins 114 of thermal component 112 to ensure thermal conductivity between die 108 and pins 114.

Figure 7:
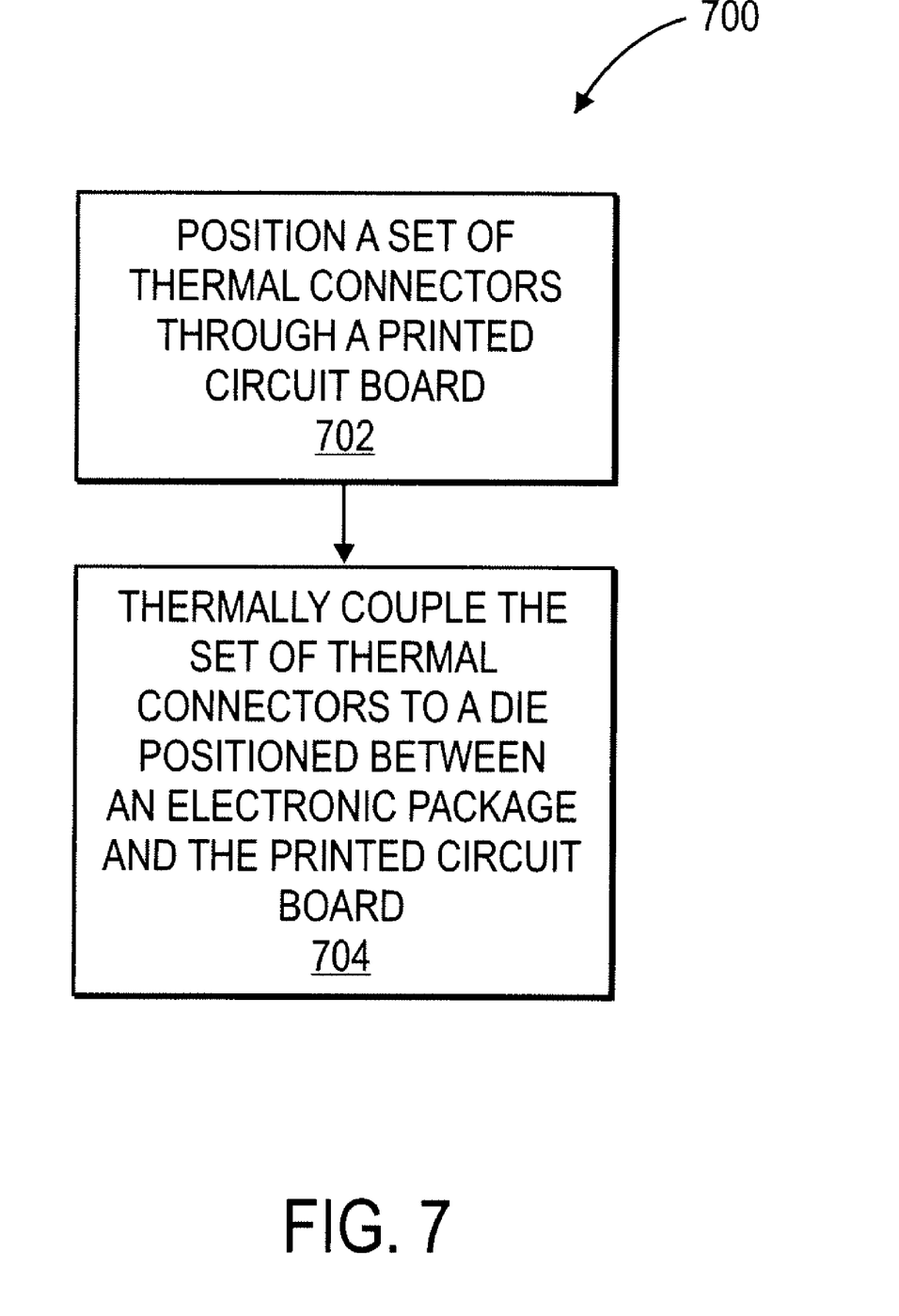
FIG. 7 shows a flow chart of a method for assembling an electronic assembly in accordance with one embodiment.

FIG. 7 shows a flow chart of a method 700 for assembling an electronic assembly in accordance with one embodiment. In this embodiment, the electronic assembly is formed by positioning a set of thermal connectors through a printed circuit board (block 702). In this aspect, the thermal connectors may be pins 114 positioned through through-holes 120 in printed circuit board 104. Alternatively, the thermal connectors may be filled thermal vias (e.g., solid cylinders formed of copper) through printed circuit board 104. The thermal connectors may be thermally connected to a die positioned between an electronic package and the printed circuit board (block 704). For example, in embodiments where the thermal connectors are pins, pins 114 may be connected to die 108 as described in reference to FIG. 1 and FIG. 2. Alternatively, where the thermal connectors are filled thermal vias, solder may be applied to an end of the thermal vias extending to the primary side of printed circuit board 104 to connect the thermal vias to heat spreader 202. Heat spreader 202 may then be connected to die 108 as previously described.

In the preceding detailed description, specific embodiments are illustrated, including techniques for cooling dies connected to the secondary side of a package. It will, however, be evident that various modifications and changes may be made thereto without departing from the broader spirit and scope of the invention as set forth in the claims. For example, thermal components described herein may be modified to accommodate various form factor limitations in the area adjacent the secondary side of the printed circuit board, for example, the mechanical envelope designed for some standard computer chassis. It is contemplated that the cooling configuration described herein is suitable for use with a wide variety of electronic appliances that would benefit from the embodiments described herein. The specification and drawings are, accordingly, to be regarded in an illustrative rather than a restrictive sense.

What is claimed is:

1. An apparatus comprising:
    a first die having a first side mounted on a primary side of an electronic package, the first die having a second side coupled to a first heat spreader;
    a second die mounted on a secondary side of the electronic package, between the electronic package and a first side of a printed circuit board; and
    a thermal component thermally coupled to the second die and a second side of the printed circuit board, the thermal component comprising a set of pins extending from a second heat sink through a set of through-holes in the printed circuit board and thermally coupled to a surface of the second die, wherein a length of the set of pins is modifiable to accommodate height tolerances in a socket stack up between the printed circuit board and the electronic package.

2. The apparatus of claim 1, the thermal component further comprising:
    a second heat spreader coupled to the set of pins.

3. An apparatus comprising:
    a first die mounted on a primary side of an electronic package;
    a second die mounted on a secondary side of the electronic package, between the electronic package and a printed circuit board; and
    a thermal component thermally coupled to the second die and the printed circuit board, the thermal component comprising a set of pins extending from a heat sink through a set of through-holes in the printed circuit board, wherein a length of the set of pins is modifiable to accommodate height tolerances in a socket stack up between the printed circuit board and the electronic package, wherein the pins occupy about 15 percent or less of a surface area of a portion of a surface of the printed circuit board.

4. The apparatus of claim 1, further comprising:
    a thermal interface material coupled between the second die and the thermal component.

5. The apparatus of claim 1, wherein a length of the set of pins is at least equivalent to a thickness of the printed circuit board.

6. The apparatus of claim 1, wherein the set of pins are spring connected to the heat sink.

7. The apparatus of claim 1, further comprising:
    a heat pipe coupled to the thermal component.

8. The apparatus of claim 1, wherein the thermal component is electrically coupled to the printed circuit board.

9. The apparatus of claim 4, wherein the thermal interface material comprises a composite containing metal nanoparticles.

10. A system comprising:
    an electronic appliance comprising:
        a first die having a first side mounted on a primary side of an electronic package, the first die having a second side coupled to a first heat spreader;
        a second die mounted on a secondary side of the electronic package between the electronic package and a primary side of a printed circuit board;
        the printed circuit board mounted in parallel to the second die, the printed circuit board comprising the primary side and a secondary side opposite the primary side;
        a thermal component thermally coupled to the second die, the thermal component comprising a heat sink and a set of pins, the heat sink mounted to the secondary side of the printed circuit board and the set of pins extending from the heat sink through a set of through-holes in the printed circuit board and thermally coupled to a surface of the second die; and
        a thermal interface material coupled between the thermal component and the second die.

11. The system of claim 10, the thermal component further comprising:
    a second heat spreader directly coupled to the set of pins and the thermal interface material.

12. The system of claim 10, wherein the thermal component is electrically coupled to the printed circuit board.

13. The system of claim 10, wherein the thermal interface material comprises a composite containing metal nanoparticles.

14. The system of claim 10, wherein one of the thermal interface material or the set of pins is of a dimension to compensate for height tolerances in a socket stack up between the printed circuit board and the electronic package.

15. A method comprising:
    positioning a set of thermal connectors through a set of plated through-holes formed in a printed circuit board, the set of thermal connectors extending from a primary side of the printed circuit board to a secondary side of the printed circuit board opposite the primary side wherein the thermal connectors occupy about 15 percent or less of a surface area of a portion of a surface of the printed circuit board; and
    thermally coupling the set of thermal connectors to a surface of a die positioned between an electronic package and the primary side of the printed circuit board to transfer heat from the die to the secondary side of the printed circuit board.

16. The method of claim 15, wherein the thermal connectors are pins.

17. The method of claim 15, wherein the thermal connectors are filled through-vias in the printed circuit board.

18. The method of claim 15, further comprising:
    thermally coupling a heat sink to ends of the set of thermal connectors adjacent the secondary side of the printed circuit board.

19. The method of claim 15, further comprising:
    thermally coupling the thermal connectors to the die by coupling a heat spreader to the thermal connectors and the die.

20. The method of claim 15, further comprising:
applying a thermal interface material between the die to enhance thermal contact between the die and the thermal connectors.

21. The method of claim 19, further comprising:
applying a thermal interface material to the heat spreader.

22. The method of claim 20, wherein the thermal interface material comprises a composite containing metal nanoparticles.

23. The method of claim 15, wherein the set of plated through-holes are plated with a conductive material to electrically couple the thermal component to the printed circuit board.

24. The method of claim 15, further comprising:
coupling a heat pipe to the set of thermal connectors.

25. The apparatus of claim 2 further comprising: the second die coupled to the electronic package at a location opposing the location of the first die; and
the set of pins thermally coupled to a third heat spreader coupled between the printed circuit board and the surface of the second die.

26. The system of claim 10, wherein the pins occupy about 15 percent or less of a surface area of a portion of a surface of the printed circuit board.

* * * * *

UNITED STATES PATENT AND TRADEMARK OFFICE
CERTIFICATE OF CORRECTION

| | | |
|---|---|---|
| PATENT NO. | : 7,646,093 B2 | Page 1 of 1 |
| APPLICATION NO. | : 11/613523 | |
| DATED | : January 12, 2010 | |
| INVENTOR(S) | : Braunisch et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 230 days.

Signed and Sealed this

Twenty-eighth Day of December, 2010

David J. Kappos
*Director of the United States Patent and Trademark Office*